(12) United States Patent
Rasing et al.

(10) Patent No.: US 8,345,516 B2
(45) Date of Patent: Jan. 1, 2013

(54) MAGNETO-OPTICAL SWITCHING DEVICE AND METHOD FOR SWITCHING A MAGNETIZABLE MEDIUM

(75) Inventors: Theodorus Henricus Maria Rasing, Nijmegen (NL); Andrei Ivanovitch Kiriliouk, Malden (NL); Alexey Voldermarovitsj Kimel, Nijmegen (NL); Claudiu Daniel Stanciu, Nijmegen (NL); Fredrik Hansteen, Groesbeek (NL); Akiyoshi Itoh, Chiba (JP); Arata Tsukamoto, Chiba (JP)

(73) Assignee: Stichting Katholieke Universiteit, Nijmegan (NL)

( * ) Notice: Subject to any disclaimer, the term of this patent is extended or adjusted under 35 U.S.C. 154(b) by 0 days.

(21) Appl. No.: 13/290,635

(22) Filed: Nov. 7, 2011

(65) Prior Publication Data

US 2012/0257483 A1 Oct. 11, 2012

Related U.S. Application Data

(63) Continuation of application No. 12/301,958, filed as application No. PCT/NL2006/000264 on May 24, 2006, now Pat. No. 8,054,713.

(51) Int. Cl.
*G11B 11/00* (2006.01)
(52) U.S. Cl. .................................... 369/13.24
(58) Field of Classification Search ............... 369/13.24, 369/13.44, 13.46, 13.47, 13.52, 13.06, 13.54, 369/13.48, 13.38; 719/315
See application file for complete search history.

(56) References Cited

U.S. PATENT DOCUMENTS 6,894,954 B2 5/2005 Aoki 7,836,455 B2 * 11/2010 Lee et al. ................. 719/315
2006/0045141 A1 3/2006 Lee et al.

FOREIGN PATENT DOCUMENTS

| DE | 105 344 | | 4/1974 |
| EP | 0316188 | A2 | 5/1989 |
| JP | 06-103630 | | 4/1994 |
| JP | 08-250331 | | 9/1996 |
| JP | 2002-097099 | | 4/2002 |
| WO | WO 01/75894 | A2 | 10/2001 |
| WO | WO 2007/064540 | A | 6/2007 |

OTHER PUBLICATIONS

A.V. Kimel, et al. "Ultrafst non-thermal control of magnetization by instantaneous photomagnetic pulses" Nature, vol. 435, No. 2, May 25, 2005, pp. 655-657.
International Search Report for PCT/NL2006/000264 dated Jan. 22, 2007.

* cited by examiner

*Primary Examiner* — Ali Neyzari
(74) *Attorney, Agent, or Firm* — Leydig, Voit & Mayer, Ltd.

(57) ABSTRACT

The invention relates to a magneto-optical switching device for switching magnetization in a medium, comprising a magnetizable medium. According to the invention, a radiation system suited for imparting angular momentum to the magnetic spin system of said magnetizable medium, so as to selectively orient the magnetization of said medium. In addition, the invention relates to a method of switching a magnetizable medium, comprising providing a magnetizable medium; providing a radiation beam of a selectively chosen angular momentum; and targeting said radiation beam to said medium so as to transfer said angular momentum to a magnetic spin system of said magnetizable medium. Accordingly, spin states in magnetic materials can be manipulated using radiation of a suitable angular momentum. An effective magnetic field is generated for orienting the magnetization of the domains and can simultaneously be used to locally heat the material.

18 Claims, 5 Drawing Sheets

MAGNETO-OPTICAL SWITCHING DEVICE AND METHOD FOR SWITCHING A MAGNETIZABLE MEDIUM

CROSS-REFERENCE TO RELATED APPLICATION

This application claims the priority benefit of Rasing et al., U.S. patent application Ser. No. 12/301,958, filed on Nov. 21, 2008, entitled "MAGNETO-OPTICAL SWITCHING DEVICE AND METHOD FOR SWITCHING A MAGNETIZABLE MEDIUM," which claims the priority benefit of Rasing et al., International Application PCT/NL2006/000264 filed May 24, 2006, entitled "MAGNETO-OPTICAL SWITCHING DEVICE AND METHOD FOR SWITCHING A MAGNETIZABLE MEDIUM" the contents of which are expressly incorporated herein by reference in their entirety, including any references therein.

FIELD

The present invention relates to a magneto-optical switching device for switching magnetization in a medium, in particular, for information recording purposes. In addition, the invention relates to a method of switching a magnetizable medium.

BACKGROUND

In magnetic and magneto-optical switching devices, in particular, used for recording purposes, information bits are stored as oppositely oriented magnetic domains representing the values "0" and "1" respectively. The conventional way of switching spins or magnetic domains is to apply an external magnetic field along the direction of spins, opposite to their initial orientation. This is a rather slow reversal process. Alternatively the external field can be applied perpendicular and not parallel to the spin orientation. This will trigger a much faster reversal process via a precessional motion of the spins around the external applied field. A plurality of magnetic and magneto-optical recording devices is being currently manufactured using such principles for reversing magnetization and thereby write and re-write the information.

A new type of such magnetic recording devices designed to achieve ultra-high data storage densities, is the so called heat assisted magnetic recording (HAMR). Here a high anisotropy magnetic medium is heated by a laser beam such that the external applied field can still be efficient in reversing the magnetization. However, this approach does not simplify the magnetic recording process but instead involves more elements leading to high manufacturing costs of the magnetic devices as well as higher power consumption. Furthermore, by I. Tudosa et all., Nature 428, 831 (2004) and C. H. Back et al., Nature 428, 808 (2004) it has been demonstrated that the ultimate speed of magnetic switching triggered by a magnetic field is bounded in the picosecond time scale. Since the demand for ever increasing the density of data storage requires increasing of the magnetization switching speed too, new and faster ways of switching the magnetization other than by magnetic fields are desirable. Incorporated by reference, in Kimel et al. "Ultrafast non-thermal control of magnetization by instantaneous photomagnetic pulses", Nature Letters, Published online 25 May 2006, further referred to as "Nature Letters article" non-thermal excitation was demonstrated for dielectric materials. Also incorporated by reference, in Hansteen et al. "Femtosecond photomagnetic switching of spins in Ferrimagnetic Garnet Films", Physical Review Letters, 047402 (2005), further referred to as the PRL article, small angle magnetization precessions were demonstrated to have been successfully controlled. The materials in which optically induced effects were demonstrated are insulating materials.

SUMMARY

It is desirable to provide a magneto-optical switching device for switching magnetization in a medium, wherein fast and reliable switching is possible. To this end, according to an aspect of the invention, there is provided a magneto-optical switching device for switching magnetization in a medium according to the features of claim 1. In particular, there is provided: a magneto-optical switching device for switching magnetization in a medium, comprising: a magnetizable medium; and a radiation system suited for imparting angular momentum to the magnetic spin system of said magnetizable medium, so as to selectively orient the magnetization of said medium.

Accordingly, spin states in magnetic materials can be manipulated using radiation of a suitable angular momentum, in particular, circularly or elliptically polarized light.

According to another aspect of the invention, there is provided a method according to claim 15. In particular, there is provided a method of switching a magnetizable medium, comprising: providing a magnetizable medium; providing a radiation beam of a selectively chosen angular momentum; and targeting said radiation beam to said medium so as to transfer said angular momentum to a magnetic spin system of said magnetizable medium.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
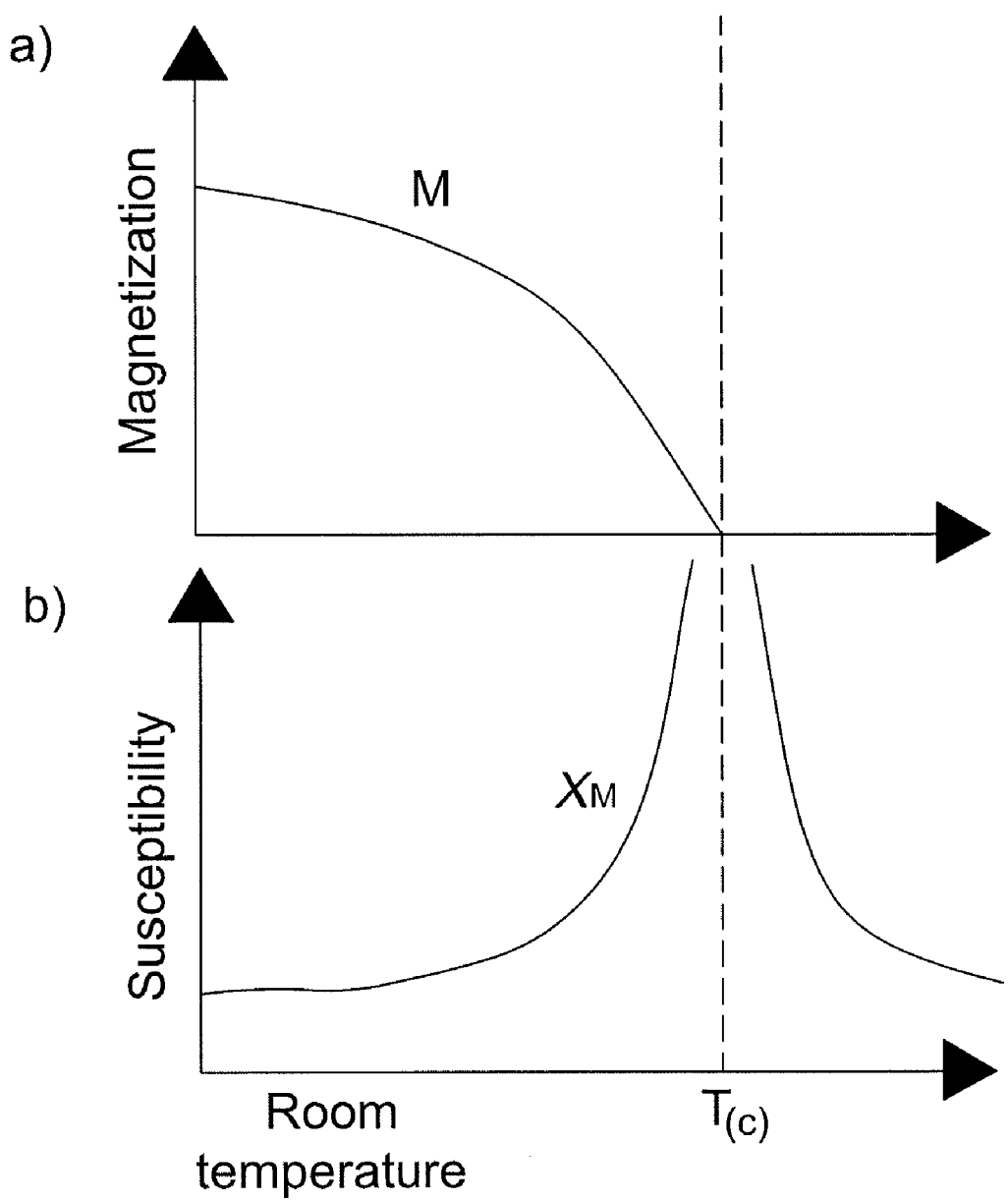
FIG. 1 shows a qualitative representation of the temperature dependence of the a) magnetization and b) magnetic susceptibility of an illustrative substrate sample.

The interaction of light with magnetized media is manifested in various magneto-optical phenomena. A good example is the Faraday effect, observed as a rotation of the polarization plane of light transmitted through a magnetic medium:

$$\alpha_F = \frac{\chi}{n} M \cdot k \qquad \text{Equation 1}$$

where $\alpha_F$ is the specific Faraday rotation, M is the magnetization, n is the refractive index, k is the wave vector of light, and $\chi$ is the magneto-optical susceptibility, which is a scalar value in isotropic media. Various devices, such as magneto-optical isolators and modulators, make use of large values of Faraday rotation in transparent magnetic compounds.

Less known is the inverse Faraday effect, where high intensity laser radiation acts on a medium as a magnetic field and induces a static magnetization M(0):

$$M(0) = \frac{\chi}{16\pi}[E(\omega) \times E^*(\omega)] \qquad \text{Equation 2}$$

where $E(\omega)$ and $E^*(\omega)$ are the electric field of the light wave and its complex conjugate, respectively. It follows from equation (2) that circularly polarized light at frequency $\omega$ should induce a magnetization along the wave vector k. Note that symmetry considerations of equation (2) indicate equivalence between photo-excitation by circularly polarized light and action of an external magnetic field. Moreover, right- and left-handed circularly polarized waves induce magnetizations of opposite sign. Equations (1) and (2) show that both these phenomena are determined by the same magneto-optical susceptibility $\chi$. In particular, in the case of the inverse Faraday effect, $\chi$ is the ratio between the induced magnetization and the laser intensity. Therefore, optical control of magnetization is expected to be most efficient in materials with high values of the Faraday rotation per unit magnetization. Another important property of the susceptibility $\chi$ is that it has no symmetry restrictions and is thus allowed in all media, regardless of their crystallographic and magnetic structures. Moreover, the inverse Faraday effect does not require absorption, and is believed to be based on a Raman-like coherent optical scattering process. This has the important consequence that the effect of light on the magnetization is non-thermal and can be considered as instantaneous because it appears to take place on a femtosecond timescale. Recent theoretical work has indicated the possibility of laser-induced spin reversal on a femtosecond timescale. However, the experimental demonstration of such non-thermal ultrafast optical control of magnetization has remained an intriguing challenge until now.

According to an aspect of the invention angular momentum is imparted by a radiation system, to the magnetic spin system of said magnetizable domains, so as to orient the magnetization thereof. In particular, circularly or elliptically polarized light is used to control and/or to switch the magnetization in magnetic materials, such as used in magneto-optical devices or in thermally assisted magnetic random access memory (MRAM). More specifically, left-handed circularly-polarized light oriented the spins of the magnetic system in one direction whereas right-handed circularly-polarized light oriented the spins in the opposite direction. As the invention is understood, an effective magnetic field is generated for orienting the magnetization of the domains and can but not necessarily has to simultaneously be used to locally heat the material. This process is shown to be fundamentally different from the orientation according to external magnetic fields and is shown to be intrinsically very fast and of an optical nature. Moreover, since no external field is required this process is simplified with consequences on the manufacturing costs.

In FIG. 1 a qualitative representation of the temperature dependence is shown of the a) magnetization and b) magnetic susceptibility in an illustrative substrate sample, above room temperature. As is well known, the magnetization M in a material is proportional with the effective field acting on it:

$$M = \chi_M \cdot H$$

and depends on the magnetic susceptibility of the material $\chi_M$. At Curie temperature $(T_C)$ $\chi_M$ diverges [FIG. 1(b)]. Thus, the magnetic field required to control the magnetization has its minimum near the Curie temperature and a relatively low magnetic field may be still higher than the coercive field of the material. Thus, the magnetic field induced by the helicity of the laser beam can orient the magnetization of the material preferably most effectively near the Curie temperature.

Figure 2:
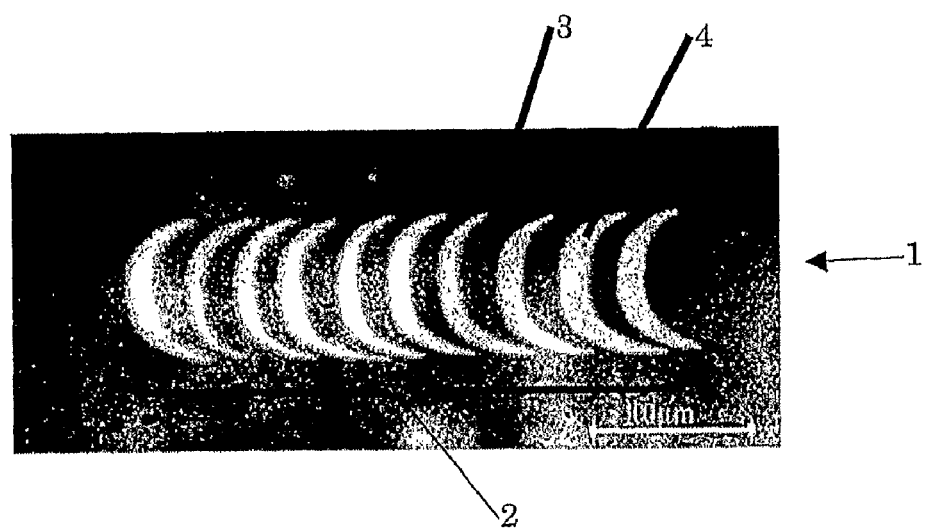
FIG. 2 shows an image of magnetic domains observed via Faraday Effect and captured by a CCD camera.

Turning to FIG. 2, a recording track 1 of magnetic domains 2 are shown, observed via Faraday effect using a conventional optical microscope scheme. The black region 3 represents magnetic domain 2 with magnetization oriented in one direction perpendicular on the sample which we shall name "down". Consequently the white regions 4 represent magnetic domains 2 orientated in the opposite direction, "up". The initial state of the sample had magnetization "down" oriented (black). The domains 2 where created by sweeping the laser beam over the sample and changing alternatively the circularity of light between the right and left-handed circularly polarized light. Therefore one type of circularly polarized laser pulses are creating up domains, reversing the initial state of the sample, while the opposite circularly polarized laser pulses try to orient the magnetization in the same direction as the initial state therefore living the initial state unchanged. The repetition rate of the helicity of the laser beam was chosen in conjunction with the scanning velocity of the beam relative to the sample, so that the spots were written partially overlapping, resulting in neighbouring black and white semi-circles. The experiment was performed at room temperature and the laser fluence used was of about 5 mJ/cm^2. However the experiment can be reproduced at any temperature depending on the magnetic material properties. Moreover the material properties define also the laser fluence required for an effective manipulation of the magnetization.

Figure 3:
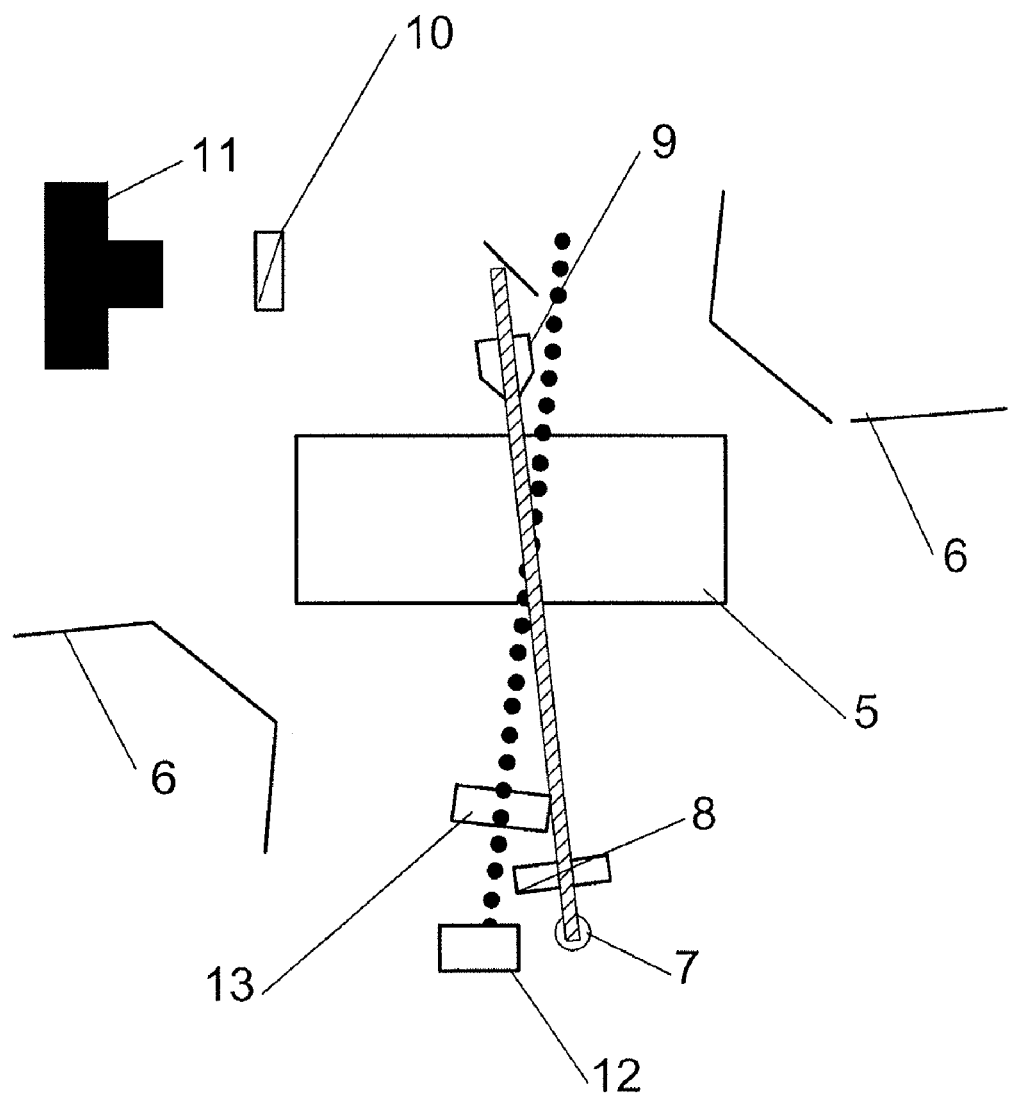
FIG. 3 shows a schematic illustration of the experimental setup.

During a sweep, the polarization state of the laser beam was alternated between right and left helicity using a quarter wave plate 13 as illustrated in FIG. 3. Keeping the sweeping speed relatively constant, an average intensity of the laser and corresponding thermal load is kept substantially constant. Here, the width of the recording track 1 depends on a combination of the laser beam spot size, a laser beam profile, as well as the pulse width and intensity. In practical embodiments, the target temperature for magnetic switching may be tuned optimally by a combination of scanning velocity, intensity, wavelength and thermal absorber materials may be arranged in the substrate to provide a target temperature for magnetic switching, as well as tuning absorption properties, heat conduction, optomagnetic response, in particular, Curie temperature, of the target material.

The impact of laser pulses with the magnetic materials has a heating effect on the material which in turn leads to a decrease of the magneto-crystalline anisotropy of the material. This effect is used in conventional magnetic and magneto-optical recording as well as in the recently developed HAMR scheme, to decrease the coercivity of the sample such that small external magnetic fields can change the state of the magnetization in the material of interest. On the other hand, as it is demonstrated here, if the laser pulse is also circularly polarized, light, besides the heating effect, or, in cases with no or little absorption, even without the heating effect, also orients the spins in the material. Such demonstration may be advantageous not only for simplification of spin manipulation processes but also for the speed of these processes. More specifically, since the magnetization or spin orientation depends on the light helicity the orientation of the angular momentum of the photons affect the magnetic system only while the laser pulse is present in material. Therefore the initiation of the reorientation process take place on the femtosecond time scale.

FIG. 3 shows a schematic illustration of an experimental setup. In particular, an initial state of a sample 5 was prepared by use of an electromagnet 6. In the typical case, due to the strong anisotropy of the sample, only up or down domains are allowed to be created. Using light from a light source 7 and a polarizer 8, through the conventional Faraday rotation, the domain states can be analyzed via an objective 9 and a polarizing analyzer 10 to a CCD-camera 11.

To control and switch the magnetization in sample 5, a pulsed laser beam, delivering femtosecond laser pulses from an amplified Ti:Sapphire laser system 12 is directed to the sample 5 at a 1 kHz repetition rate. The experiment was performed at room temperature and the magnetic system was excited using 40 fs laser pulses at 800 nm wavelength. A quarter wave plate 13 was used to manipulate the polarization of the laser pulses. The laser beam is near normal incidence on the sample 5. The effect of the interaction of the laser pulses with the magnetic system was observed via Faraday effect using a conventional optical microscope scheme.

Figure 4:
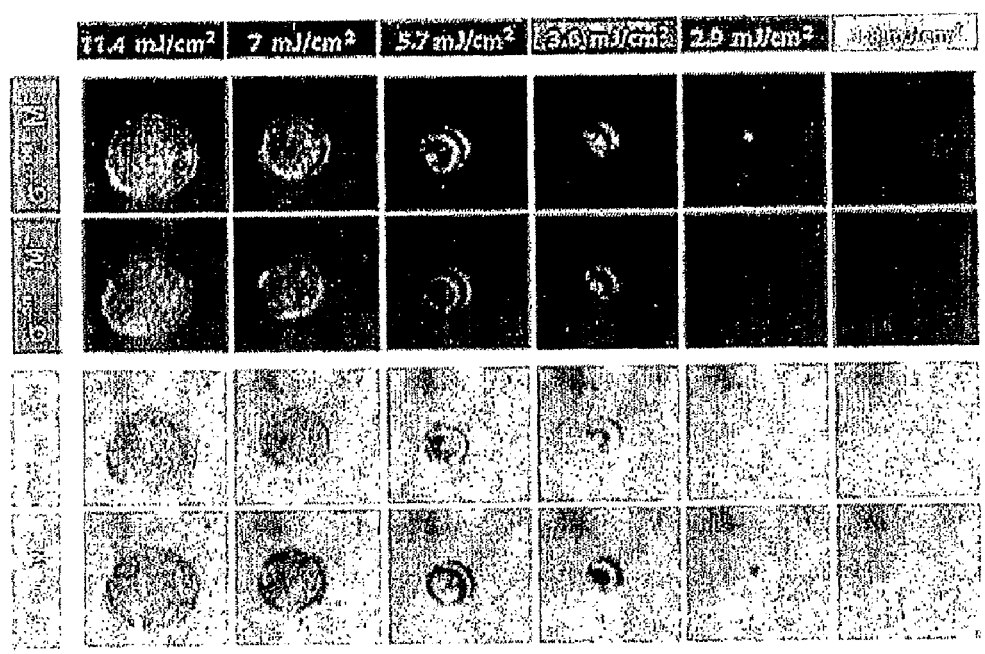
FIG. 4 shows results for laser fluence dependence on two samples of opposite magnetic states.

FIG. 4 shows results for laser fluence dependence on two cases of opposite magnetic states ($M^+$ and $M^-$), in particular, shows switching for the two opposite circular helicities ($\sigma+$ and $\sigma-$) on the down oriented initial magnetic state (first two rows) and on the up oriented initial magnetic state (last two rows). In these experiments the initial magnetic state of the sample was prepared by applying a temporarily static magnetic field to create a single magnetic state.

Next, the sample was excited by the laser beam and after closing the laser beam a picture has been acquired. In FIG. 4 it can be observe that as expected indeed for certain values of the laser beam fluence (2.9 mJ/cm2) one can observe a clean switching for one helicity of light (first row) whereas nothing is happen for the opposite helicity (second row).

Symmetrically, for the opposite initial magnetic state, the helicity which previous succeeded to switch magnetization in the sample (in first row) does not affect now the magnetic state (third row) whereas the opposite helicity now is able to induce a clean switched area (forth row).

It is shown that for high fluences a part of the laser beam profile elevates the local temperature of the sample above Curie temperature, leaving behind a demagnetized state of the sample. However, since the laser beam profile is a Gaussian profile one should expect that the region at the edge of the laser beam induces just the right temperature in the sample required for a clean laser induced switching. It follows from here that certain laser fluences indeed should induce a total switching without leaving behind demagnetizing state after switching off the laser beam. In effect, ideally, for clean switching, the centre of the beam is kept below Curie temperature, in order not to generate a demagnetised state. Although switching at higher temperatures may be feasible, it is expected that for high speed writing purposes such higher temperatures are less advantageous, since, after the information of the beam has left, the temperature of the region is still too high to keep the magnetization state. Accordingly, in a preferred embodiment of the invention, the radiation system is arranged to impart a thermal energy that is kept below Curie temperature of the magnetizable domains.

Even more so, with a temperature lowered below Curie temperature, a demagnetizing field may also reorient the areas, so that written information is lost. this is shown in FIG. 4 for higher laser fluences (higher than 2.9 mJ/cm^2 in this particular embodiment). Thus, switching may occur according to the demagnetizing field when a spot is overheated. Accordingly, preferably, the radiation system is arranged to impart a thermal energy that is substantially low so that a magnetic coercitiviy of the magnetic domains is higher than a demagnetizing field of surrounding magnetic domains.

Figure 5:
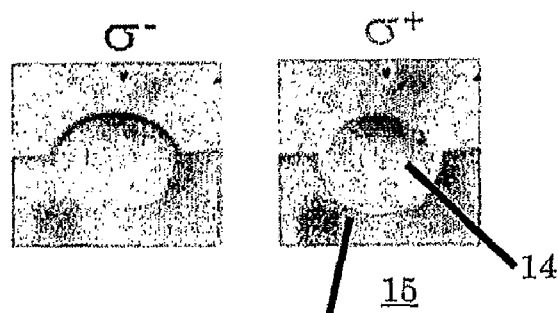
FIG. 5 shows spot images of a left handed and a right handed laser beam helicity.

As illustrated in FIG. 5, in another embodiment of the invention, the centre of the beam may reach a point higher than Curie temperature, and recording information may (only) be persistently stored in an annulus around the centre of the beam, where a beam fluence is so that the inverse Faraday magnetic field is higher than the coercive field strength and that, at least in the annulus, an imparted thermal energy in the annulus is kept below Curie temperature of the magnetizable domains. Indeed, in FIG. 5(*a*), the grey center area 14 in the middle of each spot 15 indicates partially a paramagnetic state with no magnetic contrast due to the heating by light, and partially the multidomain state after averaging over many pulses. On the outside of the spot, however, there is a clear semi-circle 16 of the reversed magnetization that depends on the light helicity. Thus, a $\sigma^+$ ($\sigma^-$) beam makes a white (black) line between the grey spot and black (white) domain.

Figure 6:
FIG. 6 shows spot images of a single laser pulse created by fast sweeping of the laser beam over the substrate.

FIG. 6 shows spot images of a single laser pulse created by fast sweeping of the laser beam over the substrate. Accordingly, it is demonstrated that the time-scale wherein the magnetization occurs lies at least within several tens of femtoseconds, in particular, less than 40 femtoseconds. Accordingly, ultrafast recording in the orders of magnitude of THz writing may be feasible using the current techniques of the invention.

The substrate material with which the experiment was performed comprises a metallic rare earth—transition metal alloy, in particular, the substrate comprised a typical composition of a thin film layer layer of Gd22Fe74.6Cu3.4 having Curie temperature of about 500K. The samples were grown by magnetron sputtering, usually in a multilayer structure: glass/AlTi (10 nm)/SiN (5 nm)/GdFeCo (20 nm)/SiN (60 nm). The AlTi is used as a heat sink, while the SiN is used as a buffer and capping layer. The saturation magnetization of these samples was around $4\pi m$=1000 G around room temperature.

When demagnetized in the vicinity of the Curie point as illustrated in FIG. 1, the susceptibility of the system diverges, and therefore, as demonstrated, a weak external stimulus such as the inverse Faraday effect can drive the magnetization into a certain state. It was demonstrated previously, that the inverse Faraday effect can lead to a very high effective field, which may expand the effective temperature range of this application. In addition to this, it may also be desirable and possible to tune the properties of the substrate, in order to lower the coercive field near Curie temperature, so that a wider range of temperatures may be used, and specifically, so that the laser fluence may be tuned more easily to approach the condition required to switch the magnetization. The Curie temperature may be tuned by varying the chemical composition or growth parameters so that less laser fluence is required for switching. In one embodiment, such may be done with a ferrimagnetic alloy. Another parameter of interest of the system is the demagnetizing field. In order to keep the magnetization reorientation induced by light in a wider range of temperature, also the demagnetizing field should be tuned such that its value will be below the coercive field value in the desired temperature range.

As the invention is understood, switching occurs because of two cooperating effects of the laser pulse. For metallic media, first, part of the pulse energy is absorbed by the electrons in the metal. This process leads, via the Stoner spin-scattering mechanism, to an ultrafast increase of the spin temperature. As a consequence, the temperature of the magnetic system can be drastically increased within tens of femtoseconds.

This also leads to the increase of the effective magnetic susceptibility of such system.

Second, a circularly polarized laser pulse acts on spins via spin-orbit coupling as an effective magnetic field, the effect known as the inverse Faraday effect. The amplitude of this field is proportional to the magneto-optical constants which, in first approximation, do not depend on temperature.

Thus, phenomenologically, the whole effect is the heating of the magnetic system plus the application of the effective magnetic field via the inverse Faraday effect. Because of the diverging magnetic susceptibility in the vicinity of the Curie Temperature, the switching is very efficient.

The pulse length of 40 fs implies that the whole switching is initialized within this time frame. Indeed, the inverse Faraday effect may considered to be instantaneous because it is based on a coherent scattering process. Therefore, the driving force should disappear together with the pulse.

The skilled artisan will appreciate that, in the context of this description, any use of the terms "substrate" "medium" or "material", depending on context, references the magnetizable substance to which the laser light is targeted in order to create an inverse Faraday effect there within for magnetic writing purposes. However, these substrates, in addition, may comprise a range of supporting layers that serve to stabilize, and tune the magnetic material for practical purposes. Although it is assumed that the magnetic material is deposited as a layer on top of a base substrate, other embodiments may be feasible. In addition, it may not be necessary to have the magnetic material referred to herein as a top layer.

The terms "radiation" and "beam" used herein may encompass all types of suitable electromagnetic radiation, including infrared or ultraviolet radiation.

In the application, the term "switching" refers to selectively orienting magnetization in a medium. In particular, the magnetization may be oriented between one state and another state, in particular, for switching between magnetization states. Also, the magnetization may be switched temporarily from a base state to a temporary state.

While specific embodiments of the invention have been described above, it will be appreciated that the invention may be practiced otherwise than as described. In particular, while the embodiments focus on magnetic recording applications, the invention is not limited thereto. The radiation induced magnetization as described hereabove state can also be used to realize an optical switch such as a Faraday rotator for laser applications. In addition, such laser induced magnetization switching can be used to manipulate optical signals in signal processing applications, for example for optical communication purposes. In particular, these types of applications can be achieved using transparent dielectric type of magnetic materials, for example, such as described in the Nature Letters article or the PRL article, but not limited to those. The descriptions above are intended to be illustrative, not limiting. Thus, it will be apparent to one skilled in the art that modifications may be made to the invention as described without departing from the scope of the claims set out below.

The invention claimed is:

1. A magneto-optical switching device for switching magnetization in a medium, comprising:
   a base substrate comprising a heat sink layer;
   a magnetizable medium stacked on the heat sink layer, the magnetizable medium comprising:
   a magnetizable domain layer consisting essentially of a metallic rare earth—transition metal alloy, and
   a capping layer; and
   an electromagnetic radiation system configured to produce an electromagnetic radiation beam having right or left handed circular or elliptical polarization of a selected angular momentum, the electromagnetic radiation system further being configured to produce a magnetized domain of a desired polarity on the magnetizable domain layer by the steps of:
   targeting the electromagnetic radiation beam at the magnetizable domain layer; and
   transferring the selected angular momentum to a magnetic spin system of the magnetizable domain, the transferring consisting essentially of irradiating the magnetizable domain through the capping layer,
   the transferring selectively orienting magnetization of a targeted part of the magnetizable domain layer in one or an opposite direction by an effective magnetic field depending on said right or left handed circular or elliptical polarization of the electromagnetic radiation beam.

2. The device according to claim 1, wherein said radiation system comprises light having a helicity that is corresponding to an information state to be recorded.

3. The device according to claim 1, wherein said radiation system is arranged to impart an intensity so that an optically induced magnetic field via the inverse Faraday effect is higher than a magnetic field strength required to switch magnetization.

4. The device according to claim 1, wherein said radiation system is arranged to impart a thermal energy that is kept below Curie temperature of the magnetizable domains.

5. The device according to claim 1, wherein said radiation system is arranged to impart a thermal energy that is substantially low so that a magnetic coercitiviy of the magnetic domains is higher than a demagnetizing field of surrounding magnetic domains.

6. The device according to claim 1, wherein the substrate comprises thermal absorber materials arranged to provide a target temperature for magnetic switching.

7. The device according to claim 1, wherein the magnetizable domains are comprised of a ferrimagnetic material.

8. The device according to claim 1, wherein the magnetizable domains are comprised of an out of plane magnetization and an out of plane anisotropy axis.

9. The device according to claim 1, wherein the magnetizable domain layer comprises Gd Fe Co.

10. The device according to claim 1, wherein the base substrate layer comprises glass, wherein the heat sink layer comprises AlTi, and wherein the buffer layer comprises SiN.

11. A recording device for recording information "bits" as regions of opposite magnetization or spins comprising a magneto-optical switching device for switching magnetization in a medium, the magneto-optical switching device comprising a device according to claim 1.

12. A method of switching a magnetizable medium of a magneto-optical switching device comprising a base substrate comprising a heat sink layer, a magnetizable medium stacked on the heat sink layer, wherein the magnetizable medium comprises a magnetizable domain layer consisting essentially of a metallic rare earth—transition metal alloy, the method comprising:
   providing a radiation beam having right or left handed circular or elliptical polarization of a selected angular momentum;
   targeting said radiation beam at the magnetizable domain layer; and
   transferring the selected angular momentum to a magnetic spin system of the magnetizable domain, the transferring consisting essentially of irradiating the magnetizable domain through the capping layer, the transferring selectively orienting magnetization of a targeted part of the magnetizable domain layer in one or an opposite direction by an effective magnetic field depending on said right or left handed circular or elliptical polarization of the electromagnetic radiation beam.

13. The method according to claim 12, wherein said magnetizable medium is chosen to have thermal properties, in conjunction with a radiation beam fluence, to elevate a target area to a temperature below the Curie temperature of the medium.

14. The method according to claim 12, further comprising selectively choosing said angular momentum so as to represent information to thereby record said information on said medium.

15. The method according to claim 12, further comprising using a pulsed radiation beam.

16. The method according to claim 15, wherein a pulse duration of said radiation beam ranges between 100 and 3 picoseconds.

17. The method according to claim 15, wherein a pulse duration of said radiation beam is less than 40 femtoseconds.

18. The method according to claim 13 wherein the providing a magnetizable medium comprises providing a non-metallic magnetizable medium, and further comprising switching said medium for optical transmission and switching purposes.

* * * * *